United States Patent [19]
Yarger et al.

[11] Patent Number: 5,017,736
[45] Date of Patent: May 21, 1991

[54] MAGNETICALLY SHIELDED DOOR FOR USE WITH SHIELDED ENCLOSURES

[75] Inventors: Eric J. Yarger, Idaho Falls, Id.; Rex D. Yarger, Brigham City, Utah; Gary D. Clegg, Idaho Falls, Id.

[73] Assignee: Magneshield Technologies, Inc., Idaho Falls, Id.

[21] Appl. No.: 274,863

[22] Filed: Nov. 22, 1988

[51] Int. Cl.⁵ .......................................... H05K 9/00
[52] U.S. Cl. .............................................. 174/35 MS
[58] Field of Search ................................ 174/35 MS

[56] References Cited
U.S. PATENT DOCUMENTS

| | | |
|---|---|---|
| 3,009,984 | 11/1961 | Lindgren .................. 174/35 MS |
| 3,256,384 | 6/1966 | Lindgren .................. 174/35 MS |
| 3,364,298 | 1/1968 | Peters ...................... 174/35 MS |
| 3,518,355 | 6/1970 | Luce ........................ 174/35 MS |
| 4,370,831 | 2/1983 | Hamilton .................. 174/35 MS X |

Primary Examiner—Leo P. Picard
Assistant Examiner—David A. Tone
Attorney, Agent, or Firm—K. S. Cornaby

[57] ABSTRACT

A door which is magnetically shielded and RF-shielded is disclosed for use with magnetically and RF-shielded room enclosures in which the door is slidably disposed within the space between the outer and inner enclosure of a shielded room, the door being actuated by pneumatic cylinders situated within the door which pressurize the door so that the door makes contact, and a tight seal, with the inner and outer enclosure walls.

12 Claims, 3 Drawing Sheets

MAGNETICALLY SHIELDED DOOR FOR USE WITH SHIELDED ENCLOSURES

BACKGROUND OF THE INVENTION

This invention presents a door shielded from magnetic and other wave frequency interferences, of either natural or man-made origin, for use with rooms or enclosures which are also shielded from such interferences. In particular, the preferred embodiments disclosed herein are designed for use with those shielded rooms disclosed in our patent for Magnetically And Radio Frequency Shielded Enclosures. Shielded enclosures and doors have been disclosed in the prior art, but none to date have been shielded from magnetic and radio frequency interferences to the extent possible with the present invention.

Shielded enclosures are frequently used in medical and scientific experimentation to test or measure magnetic or wave frequency properties. In these applications, it is critical to have an enclosure environment completely or substantially free of ambient and/or man-made interferences or disturbances. The design of the present invention provides a means of access to the shielded enclosure while providing a block to magnetic and radio frequency interferences when the door is in the closed position. The door has the capability of shielding out magnetic disturbances as well as shielding out E waves, H waves, Plain waves, radio frequencies, and Eddie currents.

SUMMARY OF THE INVENTION

In the preferred embodiment, the shielded door is actually comprised of two doors; one which seals the entrance to the outer enclosure of the room, and the second which seals the entrance to the inner enclosure of the room. The two doors are laterally connected and slideably disposed within the space existing between the outer enclosure and the inner enclosure. Pneumatic cylinder/actuators located in the space between the two doors serve to connect the two doors and to force the doors away from each other to create a seal between each door and its respective enclosure and to return doors to the collapsed position. The pneumatic cylinders are operated by pressurized air piped in from tanks located exterior to the door assembly, through a system of air hoses located in the space between the doors.

When not pressurized, the door is capable of being moved. Movement occurs by means of wheels located at the bottoms of the doors which roll along a nylon insulated "I" beam located in the bottom of the space formed between the two enclosures. The double doors are centered within the space between the two enclosures by means of wheels perpendicularly disposed to the upper edge of both doors which roll along a T guide located in the top of the space between the two enclosures.

The doors are constructed of mumetal sheets clamped to an aluminum sheet structural frame by means of mumetal strips and overlaying aluminum flat bar strips, both strips and sheets providing a seal from magnetic and other interferences. The mumetal material provides the shielding properties and any type of metal may be used which has a permeability rating equaling or exceeding 100, such as 45 Permalloy, 4750 alloy, Armco 48 Ni, Carpenter 49 alloy, Hipernik, Conpernik, Deltamax, 48 Orthonik, Hipernik V, Monimax, Sinimax, 78 Permalloy, 4-79 Permalloy, Hymu 80, Supermalloy, Mumetal, Permendur, 2V Permendur, Hiperco, Supermendur, 2-81 Moly Permalloy, and Carbonyl iron powder. Hereinafter, such metal shall be described simply as mumetal.

The door is shielded from radio frequency and other interferences by a single, double, or triple shielding system built into the door. This shielding system, and other details of the door will be more fully described in the following discussions.

BRIEF DESCRIPTION OF THE DRAWINGS

The preferred embodiment and alternate embodiments are shown in the drawings in which.

DETAILED DESCRIPTION OF THE PREFERRED EMBODIMENT

Figure 1:
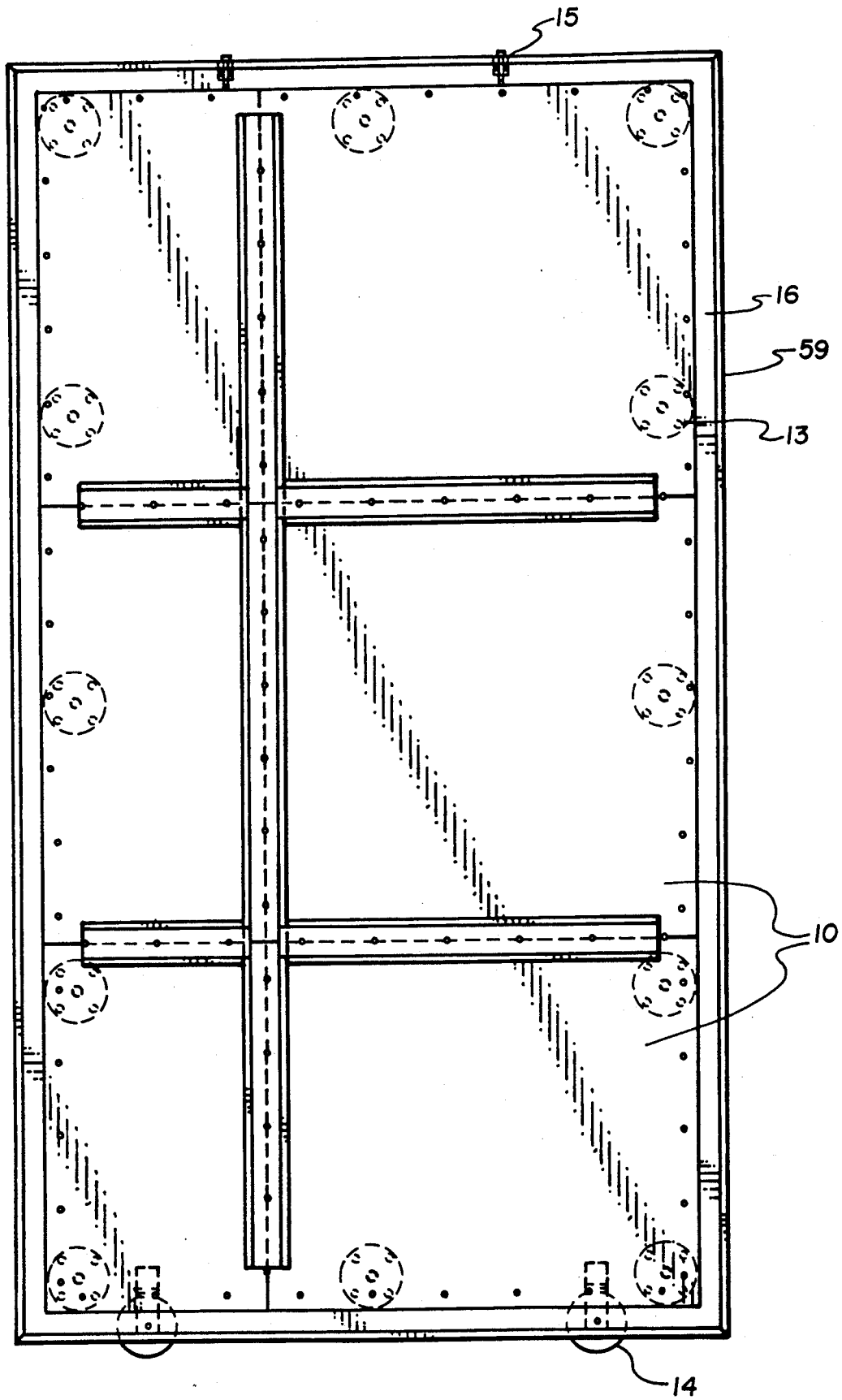
FIG. 1 is an elevational view of the side of the total door which would be viewed facing the front of the room from the outside without interference from the walls.

The shielded door is comprised of two door subassemblies; one being an inner door which seals the opening to the inner enclosure of a shielded room, and an outer door which seals the opening to the outer enclosure of a shielded room. Each door subassembly is connected to the other door subassembly so as to produce the entire shielded door, but each door subassembly is electrically insulated from the other. Each door is constructed of generally rectangular sheets of mumetal butted together, backed by a ⅛ inch sheet of aluminum which serves as the structural support. The aluminum sheet also provides RF shielding. In FIG. 1, the sheets of mumetal 10 are shown butted together. The mumetal sheets provide shielding from magnetic interferences. The seams produced by the abutted mumetal sheets are covered by mumetal strips 11 which are then overlayed with aluminum flat bar strips 12. The strips are attached to the mumetal sheets and underlying aluminum sheet 16 by means of 20 tpi stainless steel screws (not shown). Attachment of the aluminum flat bar compresses the mumetal strips and sheets and produces a pressurized seal which effectively prevents entry of any magnetic interferences. From one to three RF seals 59 may be required to effect shielding around the periphery of the door. At a minimum one copper beryllium collapsible finger seal 59 shall be installed outside of the mumetal on each door.

In an alternative embodiment both the inner door and outer door are machined with two grooves around the outer edge of the door. To these grooves are attached the RF shielding system which comprises a series of beryllium fingers and a contact strip of highly conductive silver impregnated silicon caulk material. RF shielding is also achieved by the welding of a ⅛ inch angle to the structural aluminum sheet. The edge of the angle protrudes to provide a positive RF seal when the edge fits into a groove in the structural sheet of the enclosure. The groove is covered with a silver-impregnated silicon caulk material which is imbedded into the structural wall.

The two door subassemblies are connected by means of pneumatic actuators spanning the space which exists between the two door subassemblies, and which are located around the periphery of the doors. The pneumatic actuators are supplied from two air supply manifolds, both centered on the inside surface of the inside door subassembly. Aluminum air supply lines extend outwardly from each manifold and radiate outwardly to each actuator. The air supply manifold attached to the inside door subassembly supplies air to the pneumatic actuators located on each door. One manifold supplies air to the door-open side of each actuator, the other manifold supplies air to the door-closed side of each actuator. The air manifolds supply air equally to one side of all of the actuator cylinders at a time through an air supply switching system mounted on the inner and outer enclosure walls. Enough loop is allowed in the hoses to prevent connection stress and allow freedom of movement for the door. The actuators are pneumatically driven in both the open and closed directions. When the actuators are in the door-open position, each subassembly moves inwardly toward each other which allows the entirety of the door to be moveable in a lateral direction. When the door is in position blocking the enclosure openings and the actuators are extended, the door subassemblies are forced apart from each other producing a tight seal between the mumetal of the doors and the mumetal of the respective enclosures to effectuate magnetic shielding.

The entire door slides laterally by means of wheels 14 located at the bottom of each subassembly and by centering wheels located at the top of each subassembly. These features and others are shown in greater detail in FIG. 2.

Figure 2:
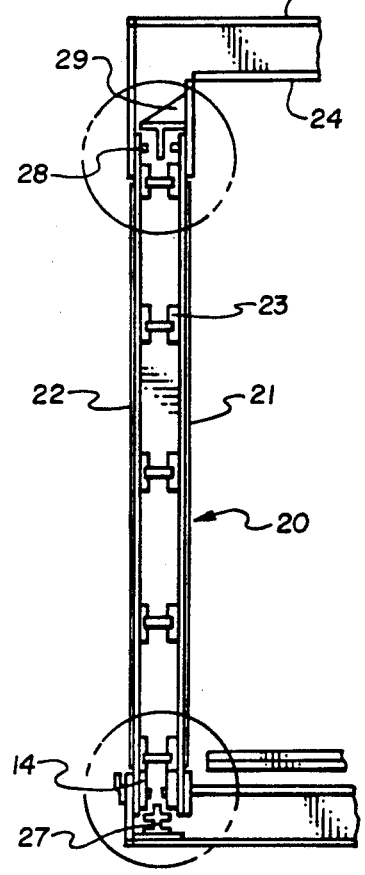
FIG. 2 is a cross-sectional view of the doubled door system disposed within the space between the outer and inner enclosures.

In FIG. 2, the door, generally at 20, is seen to be comprised of an inner door subassembly 21 and an outer door subassembly 22 connected together by pneumatic actuators 23 disposed between the two door assemblies. The inner door subassembly 21, when in the closed position, covers the opening to the inner enclosure 24. Similarly, the outer door subassembly 22, when in the closed position, covers the opening to the outer enclosure 25. The door assembly as a whole is disposed within the space between the outer and inner enclosures. Door centering and movement of the door in a lateral direction is facilitated by wheels 14, located at the bottom of the door subassembly, which run along a nylon insulated "I" beam 27 which is located on the upper surface of the floor of the outer enclosure and which spans the length of the front of the outer enclosure. The door maintains centrality within the space between the two enclosures by means of centering wheels 28 disposed along the top of the door subassemblies which make contact with a centering T 29 located above the door assembly. These features will be detailed further in FIGS. 3 and 4.

Figure 3:
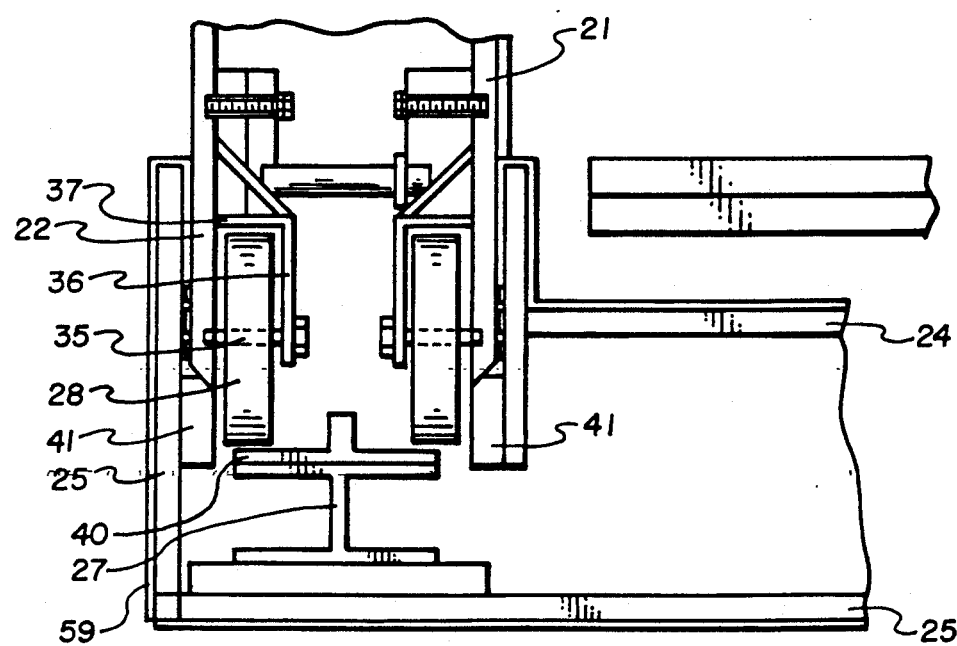
FIG. 3 is an enlarged detail of the lower portion of the door in cross-section.

FIG. 3 illustrates, in enlarged detail, the bottom of the door assembly shown in cross-section. Again, the inner door subassembly 21 is shown compressed against the opening of the inner enclosure 24, and the outer door subassembly 22 is shown compressed against the opening of the outer enclosure 25. Both the inner and outer doors are beveled to a 45 degree angle along the outer edge, a treatment which aids self-centering of the door when in the closed position.

To the bottom of each door subassembly is attached two stainless steel austenetic wheels 34, one near each corner of the bottom edge of the door. Each wheel is attached to the aluminum structural sheet of the door to which it is attached by means of a bolt 35 which passes through the outer flange 36 of wheel housing element 37. The wheels roll along an "I" beam 27 situated on the upper surface of the floor of the outer enclosure 39 which extends the length of the front of the shielded room. The "I" beam is insulated with a nylon insulating and door centering strip 40 applied to the upper surface of the beam. As the door is pulled into the closed position, the wheels rotate along the nylon-insulated "I" beam until the door is in position and the door-closed sensing switch is actuated. Then the pneumatic cylinders are actuated and the door lifted free of the track by two nylon centering blocks 41 placed at the bottom edges of the enclosure openings. Lateral centering of the door assembly is achieved by eight nylon centering blocks located at the top and bottom of each side of each subassembly and acting on the beveled edge of each door subassembly (not shown). The nylon guides assure positive centering in the enclosure openings when the door is in the closed position. The T tracks and wheels, and bottom nylon insulating/centering strip assure positive centering when the door is in the retracted position.

Figure 4:
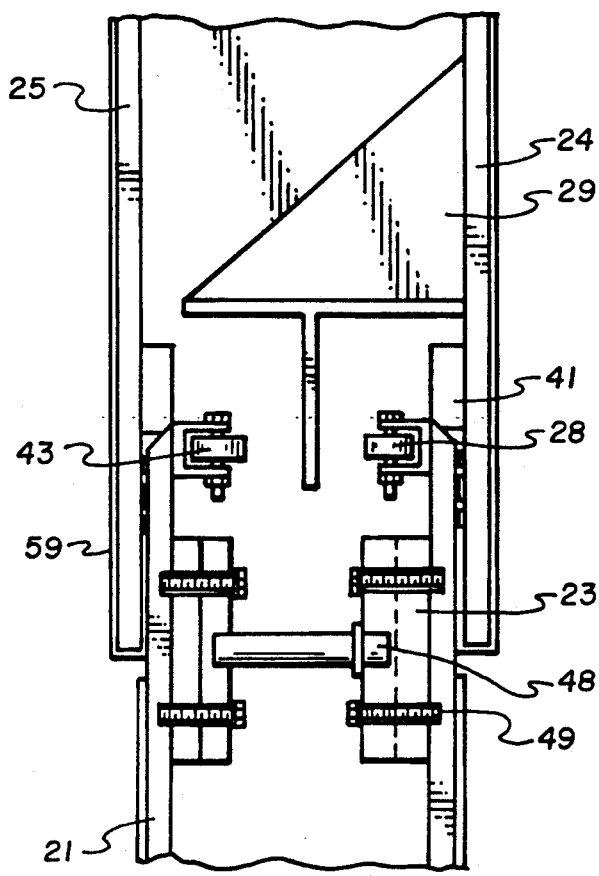
FIG. 4 is an enlarged detail of the upper portion of the door in cross-section.

In FIG. 4, the upper portion of the door assembly is shown in enlarged detail, and it can,;be seen that the aluminum structural sheet of either door subassembly is beveled for self-centering. The nylon centering blocks 41 also aid in maintaining centrality in the door. Centering and guiding of the door in its movement is also achieved by contact between four centering wheels 28, two attached to the upper edge of each door, and a centering T 29 built into the space between the outer enclosure 25 and inner enclosure 24.

A pneumatic actuator 23 is shown attached to either door, joined centrally by a stainless steel Rod attached to a pressure foot 48. The actuators are attached to the aluminum structural sheet of either door by stainless steel screws 49. Movement of the door is caused by operation of either of two manual air valve stations. One station is located inside the inner enclosure and the other station is located immediately outside the door opening of the outer enclosure. The valve is a four-way air bleed valve which supplies air to one manifold while bleeding air from the other. The door is operated from a regulated air supply which is internal to the existing building. A backup supply of air is available using monitored and alarmed bottled air. The pressure applied to the door by means of the pneumatic actuators is only that amount necessary to center the door and provide a tight contact between the mumetal of the door and mumetal of the enclosure walls. Use of air operated limit switches prevents door operation in positions which would not allow centering of the door subassemblies.

Figure 5:
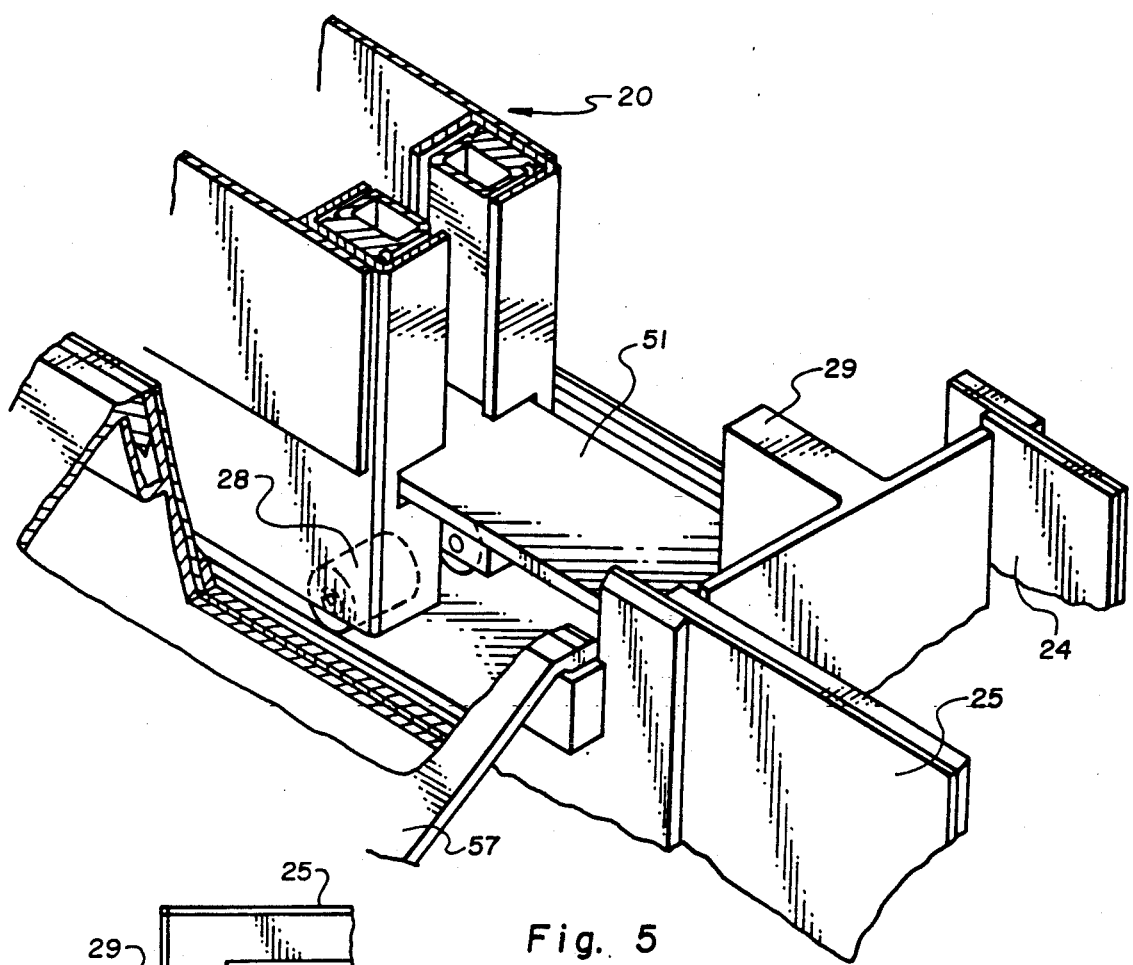
FIG. 5 is a perspective view of an alternative embodiment.

FIG. 5 illustrates an alternative embodiment in which the door, generally at 20 is guided in its lateral movement across the openings in the enclosures by means of a metal bar 51 which extends the length of the front of the outer enclosure. The door is aided in movement by means of wheels 14 attached at the bottom of both door subassemblies. Disposed between the wall of the outer enclosure 25 and the wall of the inner enclosure 24 is a centering T 29 into which the door assembly fits at its outer edge. Access to the inner room is made via a rampway 57 attached to the outer wall of the outer enclosure.

In other alternative embodiments, the doors may not be beveled along the outer edge, and in such an embodiment, the doors would be fitted with one to three RF shielding systems.

The pneumatic expanders may be of a cylinder type, as disclosed in the preferred embodiment or they may be of a bag type or screw type. Alternatively, the door can be equipped with a mechanical leverage mechanism which can manually create expansion or contraction. Such a lever would be located on the outer door facing. In other configurations, the door may be constructed of a frame with magnetic shielding attached thereto with a lightweight RF screening or similar RF shielding material used in place of the aluminum sheet of the preferred embodiment. The RF seals may be made of any suitable RF shielding material.

The door may be operated mechanically by means of a mechanical lock-down system instead of pneumatic isolators. The door can be operated electrically or electronically if a DC current is used and sufficient shielding is in place. The door may also be configured in a hinge type arrangement while still providing the necessary shielding properties.

In shielded rooms which are comprised of only one enclosure, the door disclosed herein may be comprised of a single subassembly which has mumetal, or magnetic shielding, on one or both sides. In that embodiment, alignment pins would be used to center the door.

We claim:

1. A shielded door which comprises, in combination: two identical door subassemblies, each subassembly comprising a substantially rectangular door constructed of RF shielded materials; to the upper edge of said door there being attached two wheels, disposed in an orientation perpendicular or parallel to said door, said wheels being spaced along said upper edge of said door; to the lower edge of said door there being attached two wheels disposed in an orientation parallel to said door, said wheels being spaced along said lower edge of said door; and a plurality of pneumatic expander means disposed equally around the periphery of said door;
   connection of said identical door subassemblies being made by pneumatic actuator means and pressure foot means;
   a centering guide disposed above said identical door subassemblies along which said perpendicularly or horizontally oriented wheels roll;
   an "I" beam disposed below said identical door subassemblies along which said parallel oriented wheels roll, said "I" beam being covered along its upper surface with a nylon insulating/centering strip.

2. A shielded door as set forth in claim 1 in which said identical door subassemblies are constructed of mumetal sheets butted together and attached to an underlying aluminum sheet by application of mumetal strips and overlapping aluminum flat bar to the seams produced by the abuttment of said mumetal sheets, said mumetal strips and aluminum flat bar strips being attached to said mumetal sheets and said underlying aluminum sheet by stainless steel screw means.

3. A shielded door as set forth in claim 2 in which said mumetal sheets are constructed of any type of metal with a permeability rating equaling or exceeding 100.

4. A shielded door as set forth in claim 1 in which said identical door subassemblies are constructed of a frame of magnetically-shielded material covered with a lightweight RF shielded screen.

5. A shielded door as set forth in claim 1, in which said identical doors of said subassemblies are beveled along the outer edges.

6. A shielded door as set forth in claim 1, in which said pneumatic expander means are cylindrical in shape.

7. A shielded door as set forth in claim 1, in which said pneumatic expander means are of an expandable bag type.

8. A shielded door as set forth in claim 1 in which said pneumatic expander means are of a screw type.

9. A shielded door as set forth in claim 1, in which said identical door subassemblies, when connected, are guided in their movement along said "I" beam by means of nylon guide blocks disposed along the inner edge of the inner and outer enclosure of said shielded room.

10. A shielded door as set forth in claim 1, in which said door assemblies, when connected, are moveable by mechanical means.

11. A shielded door as set forth in claim 1, in which said door subassemblies, when connected, are moveable by electrical means.

12. A shielded door as set forth in claim 1, in which said pneumatic expander means are actuated by manually operated mechanical means.

* * * * *